(12) United States Patent
Weidler

(10) Patent No.: US 6,624,623 B2
(45) Date of Patent: Sep. 23, 2003

(54) METHOD AND APPARATUS FOR DIGITALLY MEASURING THE FREQUENCY OF A SIGNAL BY INTEGRATION OF ITS SIGNAL PHASE

(75) Inventor: Gerhard Weidler, Ulm-Unterweiler (DE)

(73) Assignee: EADS Deutschland GmbH, Munich (DE)

( * ) Notice: Subject to any disclaimer, the term of this patent is extended or adjusted under 35 U.S.C. 154(b) by 52 days.

(21) Appl. No.: 09/982,989

(22) Filed: Oct. 22, 2001

(65) Prior Publication Data

US 2002/0061085 A1 May 23, 2002

(30) Foreign Application Priority Data

Oct. 20, 2000 (DE) .......................................... 100 52 304

(51) Int. Cl.$^7$ .............................................. G01R 23/02
(52) U.S. Cl. ........................ 324/76.17; 324/76; 324/47; 702/75
(58) Field of Search ................................. 375/708, 309, 375/311; 702/66, 72, 75, 76, 80, 106, 183, 189, 198, FOR 103, FOR 104, FOR 107–110, FOR 134, FOR 170; 327/113, 116, 119, 122, 350, 352; 324/76.17, 76.47, 76.48, 76.61, 76.63

(56) References Cited

U.S. PATENT DOCUMENTS

| | | | | | |
|---|---|---|---|---|---|
| 4,022,192 | A | * | 5/1977 | Laukien | 600/519 |
| RE32,845 | E | * | 1/1989 | Hayashi | 324/76.17 |
| 5,331,671 | A | * | 7/1994 | Urbansky | 375/371 |
| 6,265,860 | B1 | * | 7/2001 | Eguchi et al. | 324/76.17 |

* cited by examiner

Primary Examiner—N. Le
Assistant Examiner—Vincent Q. Nguyen
(74) Attorney, Agent, or Firm—Crowell & Moring LLP

(57) ABSTRACT

In a method and apparatus for measuring the frequency of a signal by integration of its signal phase, a phase accumulator integrates the signal phase of the signal, at predetermined time intervals. A first intermediate memory reads in a first output value of the phase accumulator after a predetermined first number of time intervals, as well as a second output value of the phase accumulator after a predetermined second number of time intervals. A second intermediate memory reads in the first output value of the first buffer register and multiplies it by a first factor which corresponds to the quotient of the second number of time intervals and the first number of time intervals. A subtracter subtracts the first output value multiplied by the first factor from the second output value; and a divider divides the output value of the subtracter by a second factor.

11 Claims, 1 Drawing Sheet

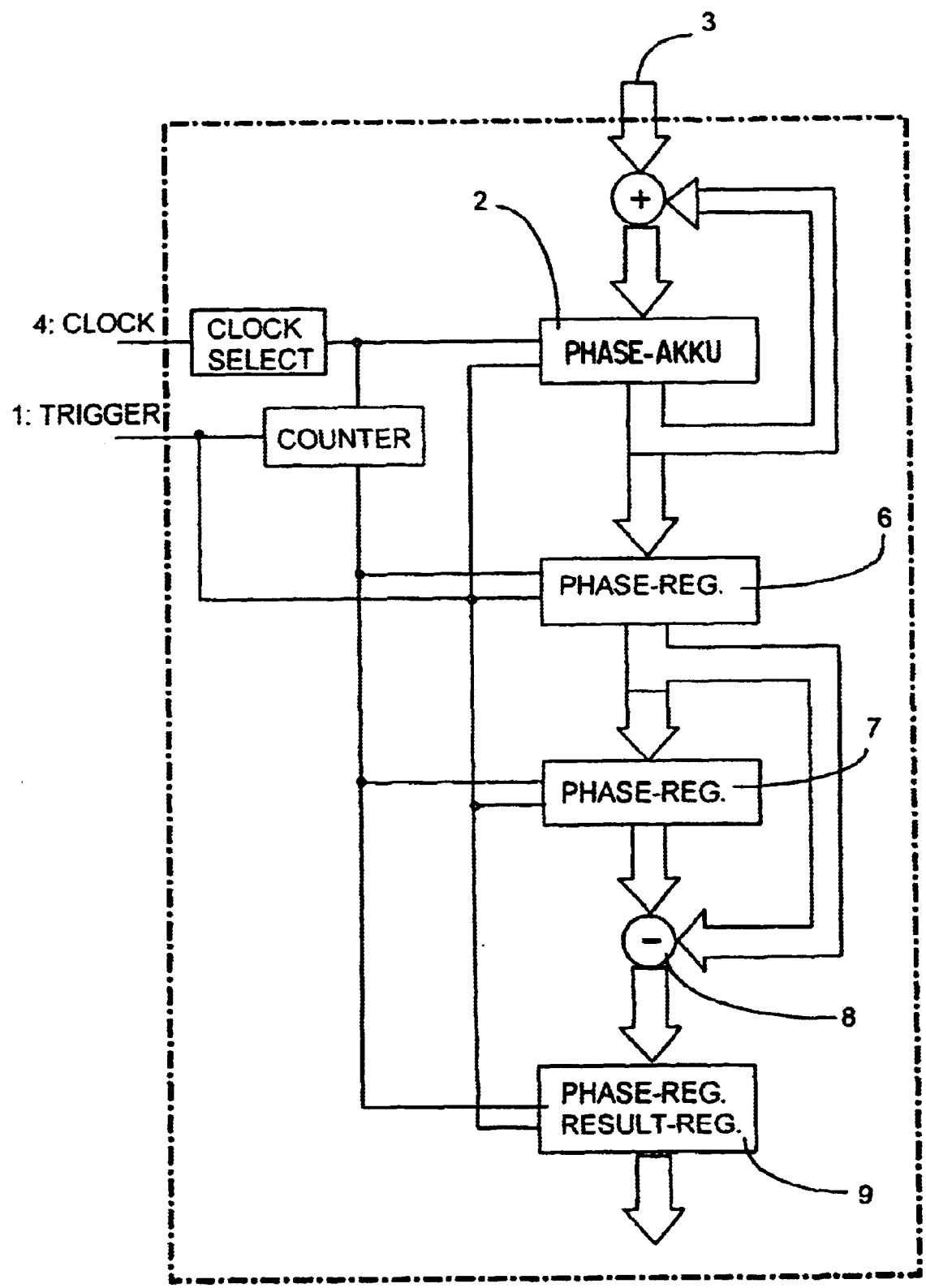

METHOD AND APPARATUS FOR DIGITALLY MEASURING THE FREQUENCY OF A SIGNAL BY INTEGRATION OF ITS SIGNAL PHASE

BACKGROUND AND SUMMARY OF THE INVENTION

This application claims the priority of German patent document 100 52 304.8, filed Oct. 20, 2000, the disclosure of which is expressly incorporated by reference herein.

The present invention relates to a method and apparatus for digitally measuring the frequency of high-frequency, pulse-type and low-frequency signals, by an integration of the signal phase.

Currently known systems and methods for measuring the frequency of high-frequency signals are based mainly on IFM frequency measurement and frequency measurement by means of a counter. IFM Instantaneous Frequency Measurement frequency measurement requires a high-expenditure analog analysis and compensation of the temperature drift of the delay elements and of the HF High Frequency component. Frequency measurement by means of a counter is based on the time measurement between zero crossings of the signal, which results in a difficult analysis in the case of very low-frequency as well as very high-frequency signals.

It is therefore an object of the present invention to avoid the above-mentioned disadvantages and to provide a system and a method by means of which the frequency of both low-frequency and high-frequency signals can be measured.

Another object of the present invention is to provide a system and a method by means of which the frequency pulse-type HF signals can also be measured.

These and other objects and advantages are achieved by the present invention, which provides a system for measuring the frequency with an integration of the signal phase. The system includes a phase accumulator by means of which the signal phase of a signal (whose frequency is to be determined) is integrated at predetermined time intervals. A first intermediate memory is controllable for reading a first output value of the phase accumulator after a predetermined first number of time intervals; and is further controllable for reading in a second output value of the phase accumulator after a predetermined second number of time intervals. A second intermediate reads in the first output value of the first buffer register and multiplies it by a first factor which corresponds to the quotient of the second number of time intervals and the first number of time intervals. A subtracter subtracts the first output value multiplied by the first factor from the second output value; and a divider divides the output value of the subtracter by a second factor which has a value corresponding to the first number of time intervals multiplied by the difference of the second number of time intervals and the first number of time intervals. The output value of the divider assumes a value which is proportional to the frequency to be measured.

Furthermore, to achieve the above-mentioned object according to the invention, a method is provided for measuring the frequency with an integration of the signal phase, which comprises the following steps: at predetermined time intervals integrating the signal phase of a signal whose frequency is to be determined; storing in a first intermediate storage the integrated signal phase after a predetermined first number of time intervals for obtaining a first output value; storing in a second intermediate storage the integrated signal phase after a predetermined second number of time intervals for receiving a second output value; multiplying the first output value by a first factor which corresponds to the quotient of the second number of time intervals and the first number of time intervals; subtracting the first output value multiplied by the first factor from the second output value for obtaining a third output value; and dividing the third output value by a second factor which corresponds to the first number of time intervals multiplied by the difference between the second number of time intervals and the first number of time intervals, for obtaining a fourth output value, the fourth output value assuming a value which is proportional to the frequency to be measured.

Other objects, advantages and novel features of the present invention will become apparent from the following detailed description of the invention when considered in conjunction with the accompanying drawings.

BRIEF DESCRIPTION OF THE DRAWINGS

The single FIGURE is a block diagram of a currently preferred circuit for measuring the frequency.

DETAILED DESCRIPTION OF THE DRAWINGS

The block diagram illustrated in the FIGURE permits a frequency measurement by means of which high-frequency and pulse-type as well as low-frequency frequencies can be digitally measured.

One problem in the case of high signal frequencies and digital measurements is mainly the computing time. Analog frequency measuring methods require high electric equipment expenditures. The present invention consists of a digital method which can easily be implemented in analog/digital ASICS and therefore opens up a wide field of application. By means of the present method and apparatus according to the invention, short HF frequency pulses can also be measured in a precise fashion. The present invention permits a partly analog and partly digital analysis which bypasses the above-described problems of the current known systems and methods.

In the present invention, the frequency measurement of a signal is always based on measuring the signal phase at various points in time. In this case, two independent signal phase measurements and the time difference respectively are used for determining the frequency as follows:

$$F_{ik} = (\phi_i - \phi_k)/t_{ik} \tag{1}$$

wherein $\phi_i$ is the phase at the point in time i; $\phi_k$ is the phase at the point in time k; and $t_{ik}$ is the time difference between the phases $\phi_i$ and $\phi_k$.

It should be noted that the phase $\phi_i$ does not end at 360° but, referring to a relative point in time, is measured in an absolute manner. Each additional measurement of the same signal source, which, during the measuring, must remain constant with respect to its signal frequency, is an independent measurement. The following equation applies to the error and to the average value Fm of n measurements:

$$F_m = \Sigma_n F_{ik}/n \tag{2}$$

In this case, the error increases with the root of n.

According to the invention, phase N is measured during a time period t at equidistant intervals. The measurement starts at the point in time t0 and the intervals amount to dt. At 2*n measurement values, a total time t of dt(2*n−1) is obtained.

For a simpler calculation, one pair of measurement values respectively with an interval n*dt is used for the frequency determination.

$$F_i(\phi_{n+i})/dt^*n \text{ and } i=1, 2, 3 \ldots \tag{3}$$

wherein $\phi_{n+i}$ is the phase at the point in time n+i; $\phi_i$ is the phase at the point in time i; and dt*n is the time difference between the phases $\phi_{n+1}$ and $\phi_i$.

For these frequencies, the average value can now be determined analogous to Equation (2) as follows:

$$F = \Sigma_n F_i / n \quad (4)$$

As a result of the not coherent integration or summation, an increase of the precision takes places which increases with the root of n.

If the above equations are now solved in the binary system, the division can present problems for fast processing. In this case, according to an advantageous aspect of the invention, the division can take place by 2n, which corresponds to a simple shift operation. For simple solution computations, n figures are expediently taken in the amount of a power of two.

When equation (3) is used in Equation (4), the average frequency value F is obtained as follows:

$$F = (1/(n^*dt^*n))^*(\phi_{n+1} - \phi_1 + \phi_{n+2} - \phi_2 + \ldots + \phi_{n+n} - \phi_n) \quad (5)$$

As an alternative, Equation (5) of the average frequency value can be computed as follows:

$$F = (1/(n^*dt^*n))^*(\Sigma_n \phi_{n+i} - \Sigma_n \phi_i) \quad (6)$$

Adding $$0 = \Sigma_n \phi_i - \Sigma_n \phi_i$$

on the right side of equation (6) yields $$F = (1/(n^*dt^*n))^*(\Sigma_{2^*n} \phi_i - 2^* \Sigma_n \phi_i) \quad (7)$$

This results in an averaged frequency measurement F over 2n equidistant measurement values as the result of the sum of all measurement values minus the double sum of the first half of the measurement values divided by n and divided by dt*n, the time basis of the individual frequency measurement.

The special advantage of this type of frequency measurement is the possibility of sequential measurement value processing by means of an integrator (adder), an intermediate memory, a simple left-shift multiplier, a subtracter and a right-shift divider.

The FIGURE shows the simple sequential course of the measurement value processing. The measurement is started by means of the trigger 1, and the phase accumulator 2 is then charged with the first phase value 3. Subsequently, by means of the phase accumulator 2, all additional phase values 3 are added or integrated according to the correct sign with each clock pulse 4 emitted by a timing circuit which is not shown. There is no limitation with respect to the sign of the phase, but it must be unambiguous and must not be formed as a modulo of 360 degrees.

After $2^k * dt$ clock pulses and correspondingly $2^k$ phase values, the phase sum emitted by the phase accumulator 2 is imported into a first intermediate register 6. This value is simultaneously multiplied by the factor 2, and imported into a second intermediate register 7. As a result, the second term ($2\Sigma_n \phi_i$) of the difference is obtained in Equation (7).

After the expiration of an additional $2^k * dt$ clock pulses or of $2^k$ phase measurement value summations, the value stored in the second intermediate register 7 is subtracted in a subtracter 8 from the new sum of the first intermediate register 6, which now corresponds to a total number of $2*2^k$ phase measurement value summations and thus to the first term ($\Sigma_{2^*n}\phi_i$) of the difference of equation (7) and then divided by $2^k * 2^k$. Advantageously, this division by $2^k * 2^k$ takes place by shifting the result of the subtraction by 2k positions to the left. The result is filed in the output register 9 and corresponds to a value of the signal frequency relative to *dt which is directly proportional to the signal frequency F.

One advantage of the present invention consists of the very easy implementability of the computation which structurally can also easily be implemented in an ASIC. The application of the invention ideally takes place in the field of digital IFMs, digital receivers and digital frequency measuring equipment.

By the method and apparatus according to the invention, the frequency of both high-frequency and low-frequency signals can be digitally detected in a simple manner. In particular, the method can also easily be implemented by single chip asics, which makes its use in receivers and similar equipment advantageous.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. Apparatus for measuring the frequency of a signal by integration of it signal phase, comprising:
    a phase accumulator which integrates the signal phase of the signal whose frequency is to be determined, at predetermined time intervals;
    a first intermediate memory which is controllable for reading in a first output value of the phase accumulator after a predetermined first number of time intervals, and which is further controllable for reading in a second output value of the phase accumulator after a predetermined second number of time intervals;
    a second intermediate memory which reads in the first output value of the first intermediate memory and multiplies it by a first factor corresponding to a quotient of the second number of time intervals and the first number of time intervals;
    a subtracter which subtracts the first output value multiplied by the first factor from the second output value; and
    a divider which divides the output value of the subtracter by a second factor having a value which corresponds to the first number of time intervals multiplied by the difference of the second number of time intervals and the first number of time intervals;
    whereby an output value of the divider is proportional to the frequency to be measured.

2. The apparatus according to claim 1, further comprising a timing circuit which generates a clock pulse that controls the phase accumulator such that all time intervals are identical.

3. The apparatus according to claim 2, further comprising devices for dividing the output value of the divider by the time interval for obtaining the frequency to be measured.

4. The apparatus according to claim 1, wherein:
    the divider comprises a shift register;
    the first number of time intervals is $2^k$; and
    the second number of time intervals is $2*2^k$, k being a natural number.

5. The apparatus according to claim 1, wherein:
    the first factor is 2; and
    the second number of time intervals is twice the first number of time intervals.

6. The apparatus according to claim 1, further comprising an output register for recording and emitting the output value of the divider.

7. A method for measuring the frequency of a signal by integration of its signal phase, comprising:

- at predetermined time intervals, integrating the signal phase of the signal whose frequency is to be determined;
- storing in a first intermediate storage the integrated signal phase after a predetermined first number of time intervals, for obtaining a first output value;
- storing in a second intermediate storage the integrated signal phase after a predetermined second number of time intervals for obtaining a second value;
- multiplying the first output value by a first factor corresponding to a quotient of the second number of time intervals and the first number of time intervals;
- subtracting the first output value multiplied by the first factor from the second output value for obtaining a third output value; and
- dividing the third output value by a second factor having a value which corresponds to the first number of time intervals multiplied by the difference of the second number of time intervals and the first number of time intervals, for obtaining a fourth output value which is proportional to the frequency to be measured.

8. The method according to claim 7, wherein all time intervals are equal.

9. The method according to claim 8, further comprising:

- dividing the fourth output value by the time interval, to obtain the frequency to be measured.

10. The method according to claim 7, wherein:

the first number of time intervals is $2^k$;

the second number of time intervals is $2*2^k$, k being equal to a natural number; and the division takes place by the shifting of the third output value by 2*k positions in a shift register.

11. The method according to claim 7, wherein:

the first factor is 2; and the second number of time intervals is twice the first number of time intervals.

* * * * *